United States Patent
Lee et al.

(10) Patent No.: US 8,559,279 B2
(45) Date of Patent: Oct. 15, 2013

(54) DATA STORAGE DEVICE HAVING MAGNETIC DOMAIN WALL MOTION AND METHOD OF FORMING THE SAME

(75) Inventors: Sung-chul Lee, Osan-si (KR);
Sung-hoon Choa, Seoul (KR);
Kwang-seok Kim, Busan (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 508 days.

(21) Appl. No.: 11/984,478

(22) Filed: Nov. 19, 2007

(65) Prior Publication Data

US 2008/0137521 A1    Jun. 12, 2008

(30) Foreign Application Priority Data

Nov. 20, 2006  (KR) .................. 10-2006-0114717

(51) Int. Cl.
*G11B 11/00* (2006.01)
(52) U.S. Cl.
USPC ..................................... 369/13.47
(58) Field of Classification Search
USPC ....................................... 369/126
See application file for complete search history.

(56) References Cited

U.S. PATENT DOCUMENTS

| | | | |
|---|---|---|---|
| 4,109,317 A | | 8/1978 | Henkler et al. |
| 4,932,012 A | | 6/1990 | Kobayashi |
| 5,390,061 A | * | 2/1995 | Nakatani et al. ........... 360/324.2 |
| 5,644,555 A | * | 7/1997 | McDaniel et al. ......... 369/13.53 |
| 5,726,837 A | * | 3/1998 | Nakatani et al. ........... 360/324.2 |
| 5,923,625 A | * | 7/1999 | Shimazaki et al. .......... 369/13.1 |
| 6,061,307 A | * | 5/2000 | Shimazaki et al. .......... 369/13.1 |
| 6,221,455 B1 | * | 4/2001 | Yasuda et al. ................. 428/64.1 |
| 6,245,450 B1 | * | 6/2001 | Kawawake et al. ........ 428/811.2 |
| 6,246,640 B1 | * | 6/2001 | Shimazaki et al. .......... 369/13.1 |
| 6,424,601 B1 | * | 7/2002 | Oonuki et al. ............. 369/13.08 |
| 6,628,574 B1 | * | 9/2003 | Shimazaki et al. ........ 369/13.09 |
| RE38,501 E | * | 4/2004 | Nishimura et al. ........ 428/819.2 |
| 6,920,062 B2 | | 7/2005 | Parkin |
| 6,937,446 B2 | * | 8/2005 | Kamiguchi et al. ....... 360/324.1 |
| 6,955,936 B2 | | 10/2005 | Uemura et al. |
| 7,113,453 B1 | * | 9/2006 | Shimazaki et al. .......... 369/13.1 |

(Continued)

FOREIGN PATENT DOCUMENTS

| | | |
|---|---|---|
| EP | 1460628 | 9/2004 |
| JP | 2006-73930 | 3/2006 |

OTHER PUBLICATIONS

Chinese Office Action dated Nov. 13, 2009 in corresponding Chinese Application No. 200710193402.8.

(Continued)

*Primary Examiner* — Adam R Giesy
*Assistant Examiner* — Henok Heyi
(74) *Attorney, Agent, or Firm* — Harness, Dickey & Pierce, P.L.C.

(57) ABSTRACT

A data storage device using magnetic domain wall motion may include a first magnetic layer having a plurality of magnetic domains. A second magnetic layer may be connected to the first magnetic layer, and a connection layer may be disposed between the first and second magnetic layers. A resistive magnetic layer may be disposed between each of the first and second magnetic layers and the connection layer. Accordingly, when current is supplied to the data storage device to move a magnetic domain wall, the leakage of current in a connection between the magnetic layers may be reduced or prevented, thus conserving power.

22 Claims, 10 Drawing Sheets

(56) References Cited

U.S. PATENT DOCUMENTS

| | | |
|---|---|---|
| 7,180,831 B2 * | 2/2007 | Murakami et al. ......... 369/13.07 |
| 2002/0048128 A1 * | 4/2002 | Kamiguchi et al. ....... 360/324.1 |
| 2003/0107956 A1 * | 6/2003 | Awano et al. .............. 369/13.43 |
| 2005/0028183 A1 * | 2/2005 | Miyakoshi ................... 720/718 |
| 2005/0078511 A1 | 4/2005 | Parkin |
| 2006/0238191 A1 * | 10/2006 | Saito ............................ 324/252 |

OTHER PUBLICATIONS

Office Action dated Sep. 27, 2007, in corresponding Korean Patent Application No. 10-2006-0114717.

European Search Report dated Feb. 26, 2008 in corresponding European Application No. 07120797.1.

\* cited by examiner

DATA STORAGE DEVICE HAVING MAGNETIC DOMAIN WALL MOTION AND METHOD OF FORMING THE SAME

PRIORITY STATEMENT

This application claims priority under 35 U.S.C. §119 to Korean Patent Application No. 10-2006-0114717, filed on Nov. 20, 2006 in the Korean Intellectual Property Office (KIPO), the entire contents of which are incorporated herein by reference.

BACKGROUND

1. Technical Field

Example embodiments relate to a data storage device, e.g., a data storage device having magnetic domain wall motion, which may write, store, and erase data by inducing magnetic domain wall motion.

2. Description of the Related Art

Recent developments in the information industry may have led to increased research relating to improved techniques for processing larger quantities of data as well as improved data storage devices for storing the larger quantities of data. A data storage device (e.g., hard disc drive (HDD)) may include a read/write head and a rotating recording medium and may have a capacity that may be up to about 100 gigabytes (GB) or more. However, a data storage device (e.g., HDD) having a rotating portion may be susceptible to abrasion, and failures may be more likely to occur during the drive of the data storage device, thereby decreasing reliability.

In recent years, increased research regarding data storage devices using magnetic domain wall motion has been conducted. A magnetic minute region constituting a magnetic body may be referred to as a magnetic domain. The directions of magnetic moment as a result of electron spins may be essentially the same in the magnetic domain. The size and magnetic polarization of the magnetic domain may be appropriately controlled using the shape and size of a magnetic material and external energy. A magnetic domain wall may refer to a boundary region between magnetic domains having different magnetic polarizations. The magnetic domain wall may be moved in response to a magnetic field or current applied to a magnetic material.

FIGS. 1A through 1C are diagrams illustrating the conventional principle of magnetic domain wall motion. Referring to FIG. 1A, a magnetic layer having a first magnetic domain 11, a second magnetic domain 12, and a magnetic domain wall 13 corresponding to a boundary region between the first and second magnetic domains 11 and 12, respectively, may be prepared.

Referring to FIG. 1B, when a magnetic field is externally applied in a direction from the second magnetic domain 12 to the first magnetic domain 11, the magnetic domain wall 13 may move in the direction from the second magnetic domain 12 to the first magnetic domain 11. Thus, the magnetic domain wall 13 may move in essentially the same direction as the direction in which the external magnetic field is applied. Similarly, when a magnetic field is applied in a direction from the first magnetic domain 11 to the second magnetic domain 12, the magnetic domain wall 13 may move in the direction from the first magnetic domain 11 to the second magnetic domain 12.

Referring to FIG. 1C, when a current (not shown) is externally supplied in a direction from the first magnetic domain 11 to the second magnetic domain 12, the magnetic domain wall 13 may move in a direction from the second magnetic domain 12 to the first magnetic domain 11. When the current is supplied, electrons may flow in an opposite direction to the direction in which the current is supplied, and the magnetic domain wall 13 may move in essentially the same direction as the direction in which the electrons flow. Thus, the magnetic domain wall 13 may move in an opposite direction to the direction in which the external current is supplied. Similarly, when current is supplied in the direction from the second magnetic domain 12 to the first magnetic domain 11, the magnetic domain wall 13 may move in the direction from the first magnetic domain 11 to the second magnetic domain 12.

The principle of magnetic domain wall motion may be applied to data storage devices, e.g., HDDs or nonvolatile random access memories (RAMs). For example, a nonvolatile memory device that writes and reads data '0' or data '1' may be embodied on the principle that a voltage of a magnetic material having magnetic domains, which may be magnetized in specific directions, and a magnetic domain wall corresponding to a boundary region between the magnetic domains may be changed as a result of the motion of the magnetic domain wall. The position of the magnetic domain wall may be changed by supplying a predetermined current to a linearly-shaped magnetic material so that the nonvolatile memory device may write and read data. Therefore, a higher integrated device having a simpler structure may be achieved.

When the principle of the magnetic domain wall motion is applied to data storage devices (e.g., HDDs or nonvolatile RAMs), multiple magnetic layers and a connection layer disposed between the magnetic layers may be provided to increase data storage density. Data may be written or read by moving a magnetic domain wall between the magnetic layers. However, when current is supplied through the connection layer interposed between the magnetic layers to move the magnetic domain wall, current density may be reduced because of leakage, thereby hindering the motion of the magnetic domain wall.

SUMMARY

Example embodiments relate to a data storage device using magnetic domain wall motion, wherein the data storage device may reduce or prevent a reduction of the current density of a connection layer so as to facilitate magnetic domain wall motion. A data storage device having magnetic domain wall motion according to example embodiments may include a first magnetic layer having a plurality of magnetic domains; a second magnetic layer connected to the first magnetic layer; a connection layer between the first and second magnetic layers; and/or a first resistive magnetic layer between at least one of the first and second magnetic layers and the connection layer. The data storage device may additionally include a second resistive magnetic layer adjacent to a region of the first magnetic layer adjoining the connection layer. The data storage device may further include a third resistive magnetic layer adjacent to a region of the second magnetic layer adjoining the connection layer.

The first, second, and/or third resistive magnetic layers may be formed of a material having about ten times to about ten thousand times the resistivity of at least one of the first and second magnetic layers. For example, the resistive magnetic layers may be formed of a material having about a hundred times to about a thousand times the resistivity of at least one of the first and second magnetic layers.

The first, second, and/or third resistive magnetic layers may be formed of a magnetic material. For example, the resistive magnetic layer may be formed of at least one of Co—Zr—Nb and Co—Fe—B. The resistive magnetic layers may also be formed of an amorphous ferro-magnet. Additionally, the resistive magnetic layers may be formed of a magnetic material doped with at least one element selected from the group consisting of Cr, Pt, Pd, Mn, Hf, Au, Ir, Fe, Co, Ni, and Si. Furthermore, at least one of the first and second magnetic layers may be formed of at least one material selected from the group consisting of Ni—Fe, Co, Co—Ni, Co—Fe, Co—Cr, Fe—Pt, and Co—Fe—Ni.

A method of forming a data storage device according to example embodiments may include forming a first magnetic layer having a plurality of magnetic domains; forming a second magnetic layer connected to the first magnetic layer; forming a connection layer between the first and second magnetic layers; and/or forming a first resistive magnetic layer between at least one of the first and second magnetic layers and the connection layer. A second resistive magnetic layer may also be formed so as to be adjacent to a region of the first magnetic layer adjoining the connection layer. Furthermore, a third resistive magnetic layer may be formed so as to be adjacent to a region of the second magnetic layer adjoining the connection layer.

BRIEF DESCRIPTION OF THE DRAWINGS

The above and other features and advantages of example embodiments may become more apparent with reference to the attached drawings, in which.

DETAILED DESCRIPTION OF EXAMPLE EMBODIMENTS

Figure 1A:
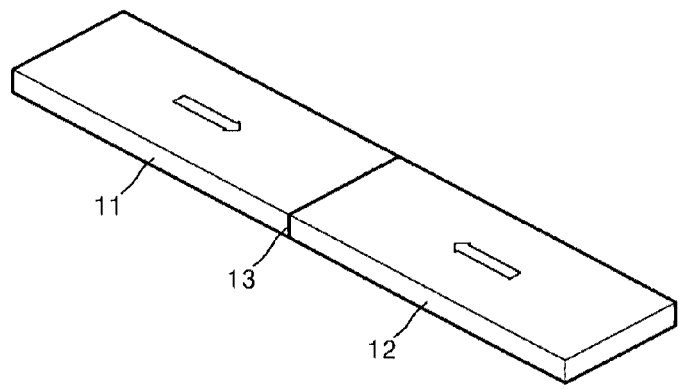
FIGS. 1A through 1C are diagrams illustrating the conventional principle of magnetic domain wall motion.
Figure 1B:
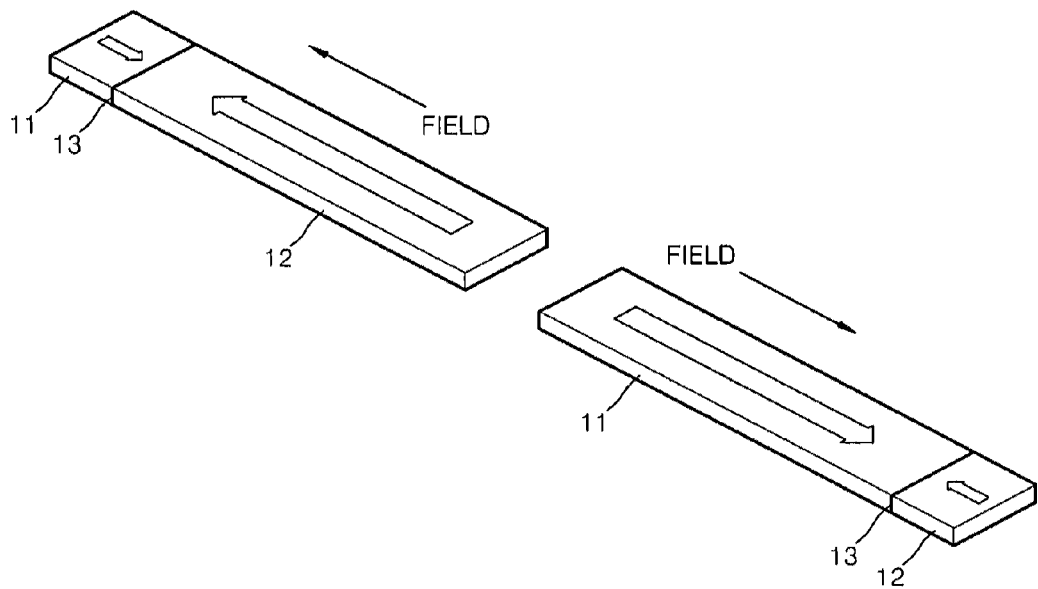
Figure 1C:
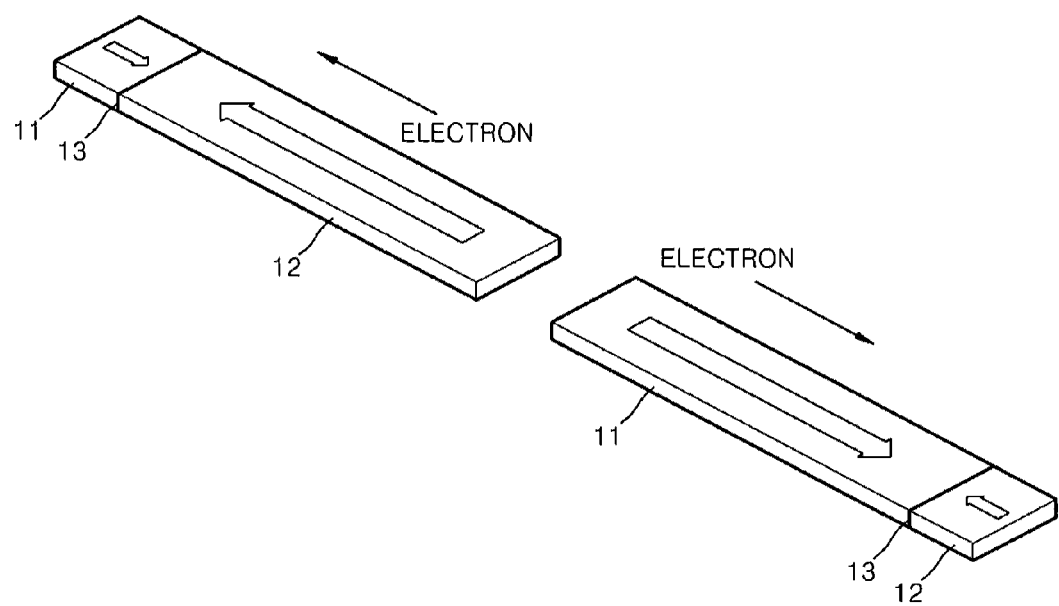

Example embodiments will now be described more fully hereinafter with reference to the accompanying drawings. In the drawings, the thicknesses of layers and regions may have been exaggerated for clarity.

It will be understood that when an element or layer is referred to as being "on", "connected to", "coupled to", or "covering" another element or layer, it may be directly on, connected to, coupled to, or covering the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, e.g., "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" may encompass both an orientation of above and below. The device may be otherwise oriented (rotated 90 degrees or at other orientations) and the spatially relative descriptors used herein interpreted accordingly.

The terminology used herein is for the purpose of describing various embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, including those defined in commonly used dictionaries, should be interpreted as having a meaning that is consistent with their meaning in the context of the relevant art and will not be interpreted in an idealized or overly formal sense unless expressly so defined herein.

Figure 2:
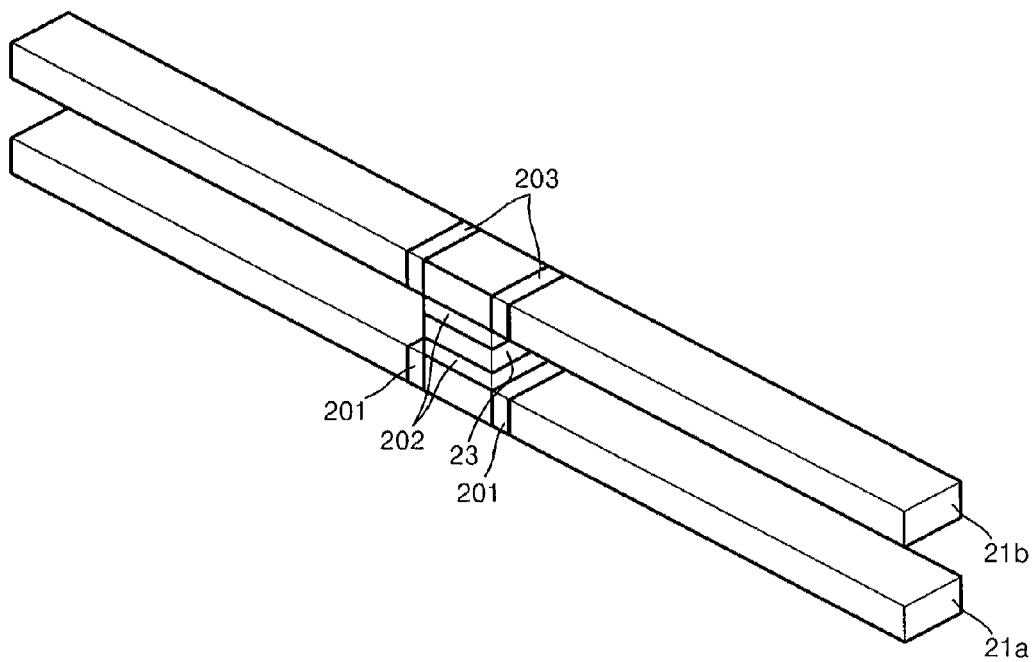
FIG. 2 is a perspective view of a data storage device having magnetic domain wall motion according to example embodiments.

FIG. 2 is a perspective view of a data storage device having magnetic domain wall motion according to example embodiments. Referring to FIG. 2, the data storage device may include a first magnetic layer 21a, a second magnetic layer 21b, and a connection layer 23 interposed between the first and second magnetic layers 21a and 21b, respectively, to connect the first and second magnetic layers 21a and 21b. The first and second magnetic layers 21a and 21b may have a plurality of magnetic domains. A first resistive magnetic layer 202 may be disposed between each of the first and second magnetic layers 21a and 21b and the connection layer 23. A second resistive magnetic layer 201 may be disposed adjacent to regions of the first magnetic layers 21a that are adjoined to the connection layer 23. A third resistive magnetic layer 203 may be disposed adjacent to regions of the second magnetic layers 21b that are adjoined to the connection layer 23.

The data storage device having magnetic domain wall motion according to example embodiments may be characterized by the forming of the first, second, and/or third resistive magnetic layers 202, 201, and/or 203 so that the diffusion of current into a connection between the first and second magnetic layers 21a and 21b may be reduced or prevented, thus facilitating the magnetic domain wall motion. This characteristic of the data storage device will now be described in more detail.

The data storage device using magnetic domain wall motion may associate a single magnetic domain with unit data and may include magnetic domains with magnetized polarizations that may be a first direction or a second direction. For example, when the magnetic polarization of a magnetic domain is an upward direction, the magnetic domain may be associated with data '1,' and when the magnetic polarization of the magnetic domain is a downward direction, the magnetic domain may be associated with data '0.' Thus, a magnetic domain with a magnetic polarization that may be an upward or downward direction may be associated with a unit bit. Operation of writing data in the data storage device using magnetic domain wall motion may involve storing a magnetic domain having a specific magnetized polarization in a predetermined position of a magnetic layer formed of a magnetic material.

For example, where the first magnetic layer 21a is a write track or a buffer track and the second magnetic layer 21b is a data storage track, a method of storing data '0' in a right region of the second magnetic layer 21b will now be described. The first magnetic layer 21a may include an upward magnetized magnetic domain and a downward magnetized magnetic domain. When supplying current to electrodes (not shown) disposed at both terminals of the first magnetic layer 21a, the downward magnetized magnetic domain may be moved to a portion of the first magnetic layer 21a under the connection layer 23. To store data in the right region of the second magnetic layer 21b, the downward magnetized magnetic domain may be moved to the right region of the second magnetic layer 21b through the connection layer 23. Thus, current may be supplied through an electrode (not shown) connected between one terminal of the first magnetic layer 21a and a right terminal of the second magnetic layer 21b. The flow of the current may be controlled in a direction from the second magnetic layer 21b to the first magnetic layer 21b. Because electrons will flow in a direction from the first magnetic layer 21a to the second magnetic layer 21b, the magnetic domain located in the portion of the first magnetic layer 21a under the connection layer 23 may pass through the connection layer 23 and move toward the right region of the second magnetic layer 21b. As a result, by locating the downward magnetized magnetic domain in a predetermined region of the second magnetic layer 21b with the application of the current, data '0' may be stored in the second magnetic layer 21b. When reading the stored data, a magnetoresistance head (not shown), e.g., a giant magnetoresistance (GMR) head or a tunneling magnetoresistance (TMR) head, may be located under the first magnetic layer 21a, and the magnetic domain may be moved from the second magnetic layer 21b through the connection layer 23 to the first magnetic layer 21a so that the magnetic polarization of the magnetic domain may be read.

When current is supplied in the direction from the first magnetic layer 21a to the second magnetic layer 21b or in an opposite direction to move the magnetic domain through the connection layer 23, the density of the current may be reduced in regions of the first and second magnetic layers 21a and 21b adjacent to the connection layer 23 because of diffusion of the current. The reduction of the current density may hinder a magnetic domain wall from moving through the connection layer 23. Consequently, the magnetic domain wall motion may lead to a rise in power consumption because of current diffusion. To overcome these drawbacks, the data storage device using the magnetic domain wall motion according to example embodiments may include the first, second, and/or third resistive magnetic layers 202, 201, and/or 203 disposed in connections for the first magnetic layer 21a and the second magnetic layer 21b. The first, second, and/or third resistive magnetic layers 202, 201, and/or 203 may reduce or prevent the diffusion of current into the connections between the first and second magnetic layers 21a and 21b, thereby inhibiting the reduction of the current density.

The first resistive magnetic layer 202 may be disposed between each of the first and second magnetic layers 21a and 21b and the connection layer 23. The second resistive magnetic layer 201 may be disposed adjacent to the region of the first magnetic layer 21a that is adjoined to the connection layer 23. The third resistive magnetic layer 203 may be disposed adjacent to the region of the second magnetic layer 21b that is adjoined to the connection layer 23. For example, without the first resistive magnetic layer 202 interposed between the first magnetic layer 21a and the connection layer 23, when current is supplied to both terminals of the first magnetic layer 21a to move the magnetic domain wall in the first magnetic layer 21a, the current may leak upward to the connecting layer 23, thereby hindering the movement of the magnetic domain wall. Therefore, the first resistive magnetic layer 202 disposed between the first magnetic layer 21a and the connection layer 23 may reduce or prevent the diffusion of the current into the connection layer 23. Also, the second resistive magnetic layer 201 may be disposed in the first magnetic layer 21a and a third resistive magnetic layer 203 may be disposed in the second magnetic layer 21b to reduce or prevent the diffusion of the current when the magnetic domain wall is moved through the connection layer 23.

As a result, the data storage device using the magnetic domain wall motion according to example embodiments may include first, second, and/or third resistive magnetic layers 202, 201, and/or 203 to reduce or prevent the leakage of current in the connections between the first and second magnetic layers 21a and 21b adjacent to the connection layer 23, thereby facilitating the magnetic domain wall motion. The first, second, and/or third resistive magnetic layers 202, 201, and/or 203 may be formed of a material having higher resistivity than the first magnetic layer 21a and/or the second magnetic layer 21b. The first, second, and/or third resistive magnetic layers 202, 201, and/or 203 may have about ten to about ten thousand times the resistivity of the first magnetic layer 21a and/or the second magnetic layer 21b. For example, the first, second, and/or third resistive magnetic layers 202, 201, and/or 203 may have about a hundred times to about a thousand times the resistivity of the first magnetic layer 21a and/or the second magnetic layer 21b.

The first, second, and/or third resistive magnetic layers 202, 201, and/or 203 may be formed of a magnetic material to permit the movement of the magnetic domain and may be further doped with another element to increase resistance. The first, second, and/or third resistive magnetic layers 202, 201, and/or 203 may be formed of a cobalt alloy, e.g., Co—Zr—Nb alloy and/or Co—Fe—B alloy. Also, the magnetic material may be doped with an element selected from the group consisting of Cr, Pt, Pd, Mn, Hf, Au, Ir, Fe, Co, Ni, and Si so as to increase the resistance of the first, second, and/or third resistive magnetic layers 202, 201, and/or 203. Additional magnetic layers (not shown) may optionally be provided on (or otherwise connected to) the second magnetic layer 21*b*. Consequently, additional resistive magnetic layers may be disposed in connections for the magnetic layers as described above.

Figure 3A:
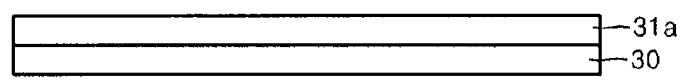
FIGS. 3A through 3J are diagrams illustrating a method of forming a data storage device having magnetic domain wall motion according to example embodiments.
Figure 3B:
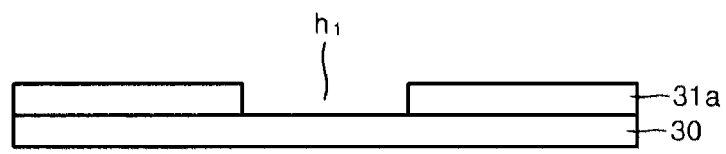

A method of forming a data storage device having magnetic domain wall motion according to example embodiments will be described with reference to FIGS. 3A through 3J. Referring to FIG. 3A, a first magnetic layer 31*a* may be formed by coating a magnetic material on a substrate 30. The magnetic material may be a vertically-magnetized material or a horizontally-magnetized material, e.g., a material used for a magnetic recording medium. For example, the magnetic material may be selected from the group consisting of Ni—Fe, Co, Co—Ni, Co—Fe, Co—Cr, Fe—Pt, and/or Co—Fe—Ni. Referring to FIG. 3B, a predetermined region of the first magnetic layer 31*a* may be etched to form a groove $h_1$.

Figure 3C:
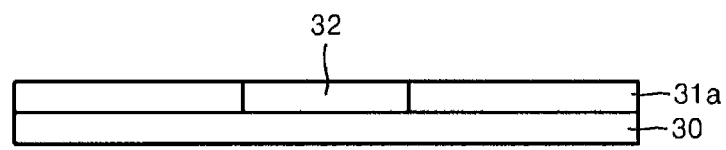

Referring to FIG. 3C, a magnetic material having higher resistivity than the first magnetic layer 31*a* may be coated on the resultant structure and planarized to form a resistive magnetic material layer 32 in the groove $h_1$. The resistive magnetic material layer 32 may be formed of a cobalt alloy, e.g., Co—Zr—Nb alloy and/or Co—Fe—B alloy. Alternatively, the resistive magnetic material layer 32 may be formed of an amorphous ferro-magnet. The resistive magnetic material layer 32 may also be obtained by doping a magnetic material with at least one element selected from the group consisting of Cr, Pt, Pd, Mn, Hf, Au, Ir, Fe, Co, Ni, and Si to increase resistance. The resistive magnetic material layer 32 may have about ten to about ten thousand times the resistivity of the first magnetic layer 31*a*.

Figure 3D:
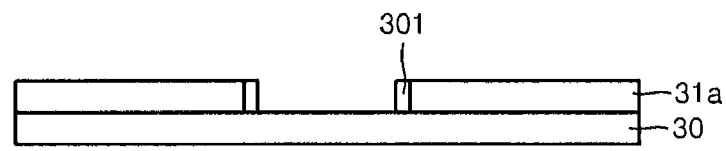
Figure 3E:
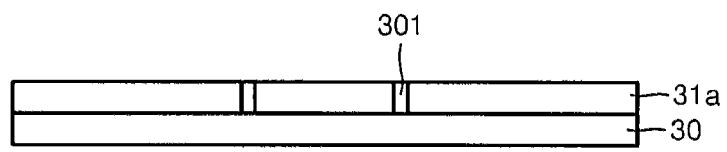
Figure 3F:
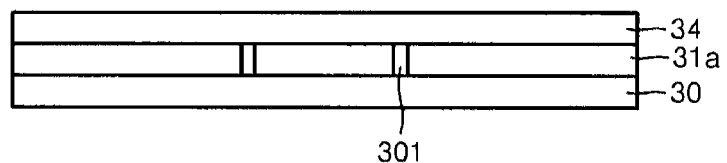
Figure 3G:
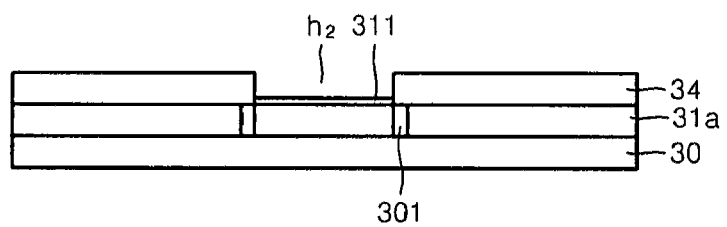

Referring to FIG. 3D, the resistive magnetic material layer 32 may be etched to form the resistive magnetic layer (e.g., second resistive magnetic layer) 301. Referring to FIG. 3E, the groove $h_1$ with the resistive magnetic layer 301 may be filled with a magnetic material, e.g., the same material as the first magnetic layer 31*a*. Referring to FIG. 3F, an insulating material (e.g., $SiO_2$) may be coated on the first magnetic layer 31*a* to form an insulating layer 34. Referring to FIG. 3G, the insulating layer 34 may be etched to form a groove $h_2$ to expose the first magnetic layer 31*a*. A resistive magnetic material may be coated on the exposed first magnetic layer 31*a* to form a resistive magnetic layer (e.g., first resistive magnetic layer) 311.

Figure 3H:
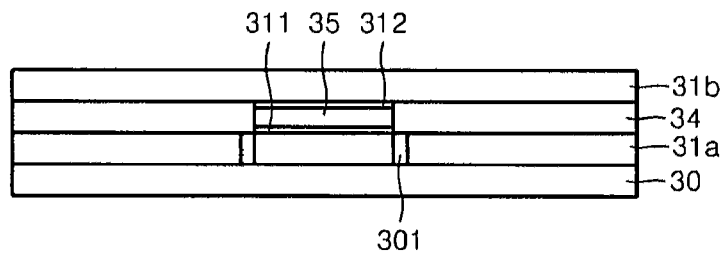

Referring to FIG. 3H, a magnetic material may be coated on the resistive magnetic layer 311 to form a connection layer 35. A resistive magnetic material may be coated on the connection layer 35 and planarized to form a resistive magnetic layer (e.g., first resistive magnetic layer) 312. The connection layer 35 may be formed of any suitable magnetic material, irrespective of whether the magnetic material is a higher-Ku or lower-Ku material. For example, the connection layer 35 may be formed of essentially the same material as the first magnetic layer 31*a*. A magnetic material may be coated on the insulating layer 34 and the resistive magnetic layer 312 to form a second magnetic layer 31*b*.

Figure 3I:
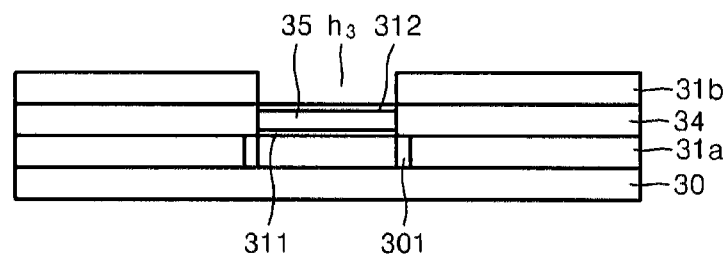
Figure 3J:
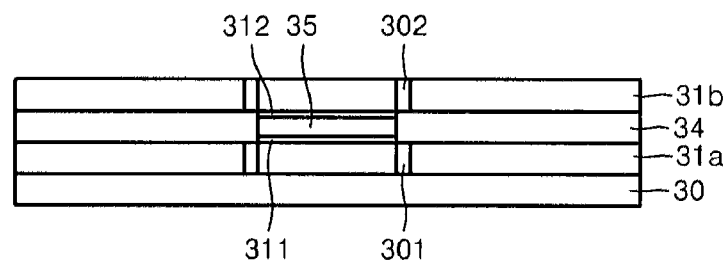

Referring to FIG. 3I, a groove $h_3$ may be provided in the second magnetic layer 31*b* to expose the resistive magnetic layer 312. The same processes as described above with reference to FIGS. 3C and 3D may be performed to form a resistive magnetic layer on the sidewalls of the groove $h_3$. Referring to FIG. 3J, the groove $h_3$ with the resistive magnetic layer (e.g., third resistive magnetic layer) 302 may be filled with a magnetic material, and the surface of the second magnetic layer 31*b* may be planarized. Additional magnetic layers may be optionally disposed on the second magnetic layer 31*b* by repeating the above-described processes.

Figure 4A:
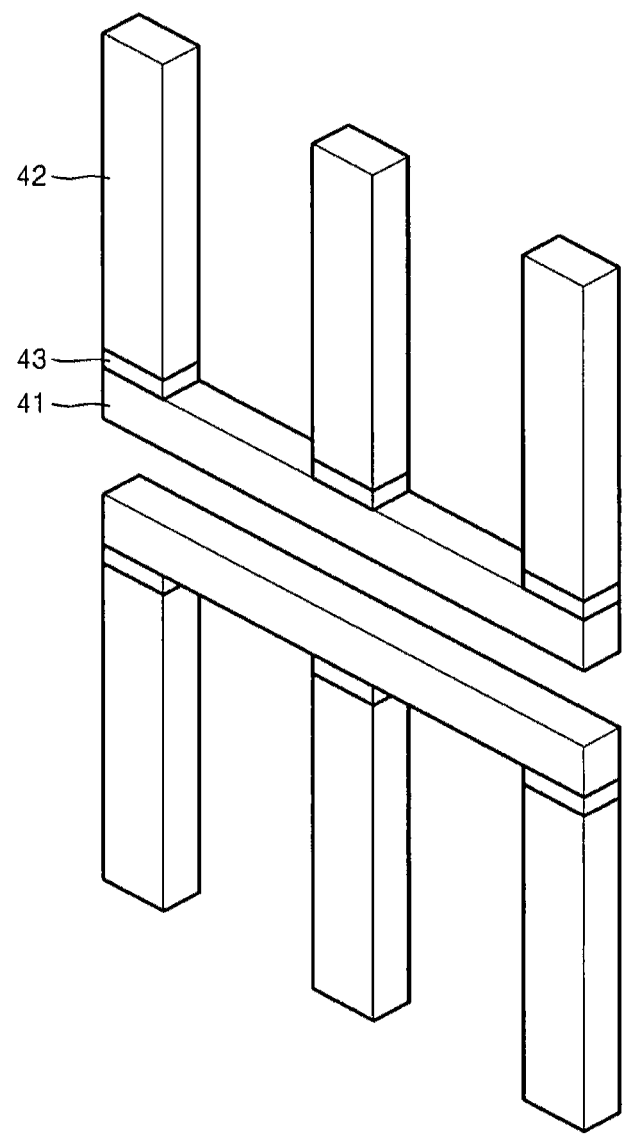
FIGS. 4A and 4B are diagrams of a variation of a data storage device having magnetic domain wall motion according to example embodiments.
Figure 4B:
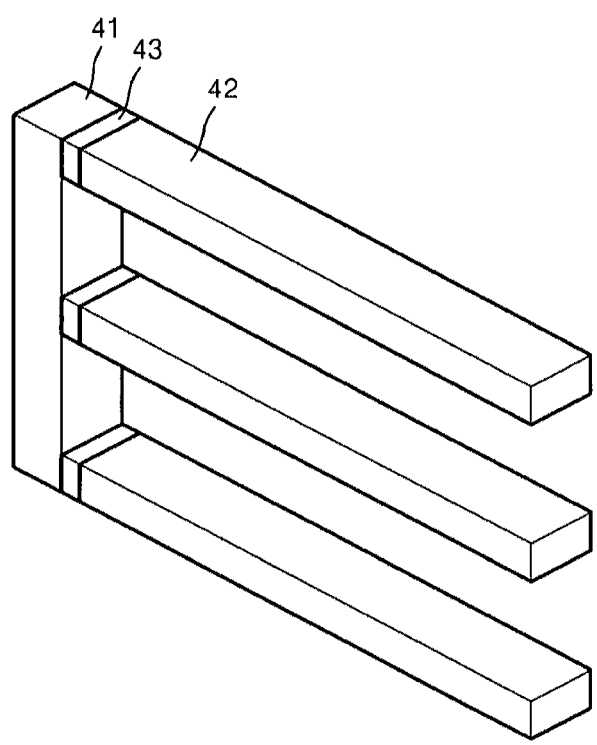

FIGS. 4A and 4B are diagrams of a variation of a data storage device having magnetic domain wall motion according to example embodiments. Referring to FIG. 4A, a plurality of second magnetic layers 42 may be vertically adjoined to a first magnetic layer 41, and a resistive magnetic layer 43 may be disposed between the first magnetic layer 41 and the second magnetic layers 42. Referring to FIG. 4B, a plurality of second magnetic layers 42 may be horizontally adjoined to a first magnetic layer 41, and a resistive magnetic layer 43 may be disposed between the first magnetic layer 41 and the second magnetic layers 42. Thus, FIG. 4A illustrates the first magnetic layer 41 disposed in a horizontal direction, while FIG. 4B illustrates the first magnetic layer 41 disposed in a vertical direction. The resistive magnetic layer 43 may be disposed in a connection (not shown) between the first and second magnetic layers 41 and 42. Furthermore, additional resistive magnetic layers (not shown) may be optionally disposed adjacent to a region of the first magnetic layer 41 that contacts the resistive magnetic layer 43.

Figure 5A:
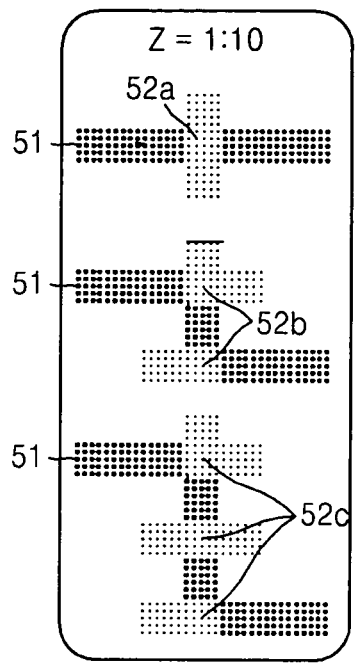
FIGS. 5A through 5C are diagrams of simulation results according to example embodiments showing the current density of a connection layer with respect to resistance.
Figure 5B:
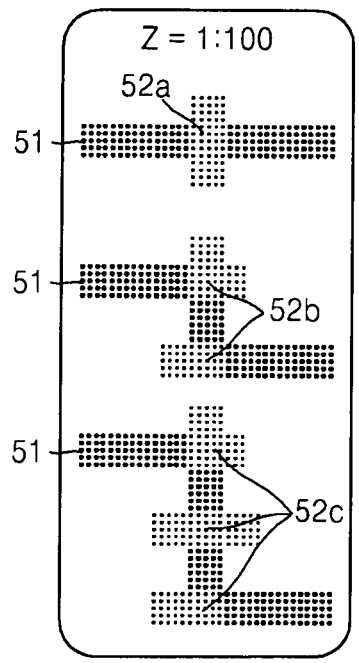
Figure 5C:
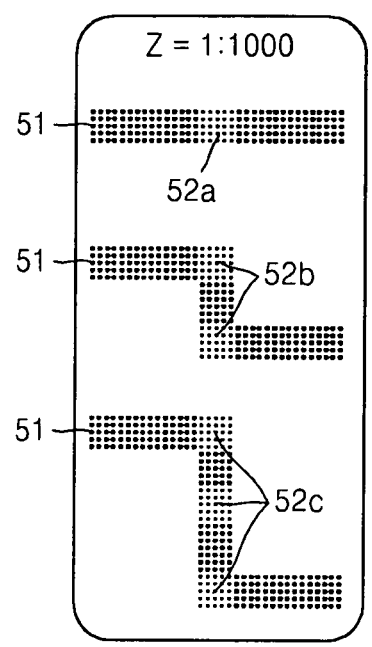

FIGS. 5A through 5C are diagrams of simulation results showing the current density of an intersection (e.g., connection) between a magnetic layer 51 and another magnetic layer where current is supplied to both sides of the magnetic layer 51 in data storage devices using magnetic domain wall motion according to example embodiments. Referring to FIGS. 5A through 5C, reference numerals 52*a*, 52*b*, and 52*c* may denote intersections (e.g., connections) between different magnetic layers. Additional magnetic layers (not shown) may be adjoined to the magnetic layer 51, and a resistive magnetic layer (not shown) may be disposed therebetween. FIG. 5A illustrates a case where a resistivity ratio of the resistive magnetic layer to the magnetic layer 51 is about 1:10. FIG. 5B illustrates a case where a resistivity ratio of the resistive magnetic layer to the magnetic layer 51 is about 1:100. FIG. 5C illustrates a case where a resistivity ratio of the resistive magnetic layer to the magnetic layer 51 is about 1:1000.

As shown in FIG. 5A, when the resistive magnetic layer has about ten times the resistivity of the magnetic layer 51, current density may be reduced to a larger degree at the connections 52*a*, 52*b*, and 52*c*. As the resistivity ratio of the resistive magnetic layer to the magnetic layer 51 increases, the current density of the connections 52*a*, 52*b*, and 52*c* may gradually increase. As shown in FIG. 5B, when the resistive magnetic layer has about a hundred times the resistivity of the magnetic layer 51, current density may be reduced to a lesser degree at the connections 52*a*, 52*b*, and 52*c*. As shown in FIG. 5C, when the resistive magnetic layer has about a thousand times the resistivity of the magnetic layer 51, the reduction in the current density at the connections 52*a*, 52*b*, and 52*c* may be relatively small. As a result, a data storage medium using magnetic domain wall motion and having multiple magnetic layers may benefit from a resistive magnetic layer having higher resistivity at a connection between the magnetic layers so as to suppress a reduction in the current density.

As described above, a data storage device using magnetic domain wall motion according to example embodiments may include a resistive magnetic layer disposed at a connection between multiple magnetic layers. Thus, when current is supplied to move a magnetic domain wall, current diffusion may be reduced or prevented, thereby helping to maintain current density at the connection. Furthermore, by reducing or preventing a reduction in the current density, power may be conserved when data is written to or read from the data storage device.

While example embodiments have been disclosed herein, it should be understood that other variations may be possible. Such variations are not to be regarded as a departure from the spirit and scope of example embodiments of the present disclosure, and all such modifications as would be obvious to one skilled in the art are intended to be included within the scope of the following claims.

What is claimed is:

1. A data storage device using magnetic domain wall motion, comprising:
   a first magnetic layer having a plurality of magnetic domains and a magnetic domain wall between two adjacent magnetic domains, the magnetic domain wall being movable in the first magnetic layer;
   a second magnetic layer connected to the first magnetic layer;
   a connection layer between the first and second magnetic layers, the connection layer being made of a magnetic material; and
   a first resistive magnetic layer between at least one of the first and second magnetic layers and the connection layer.

2. The device of claim 1, further comprising:
   a second resistive magnetic layer adjacent to a region of the first magnetic layer adjoining the connection layer.

3. The device of claim 1, further comprising:
   a third resistive magnetic layer adjacent to a region of the second magnetic layer adjoining the connection layer.

4. The device of claim 1, wherein the first resistive magnetic layer is formed of a material having about ten times to about ten thousand times the resistivity of at least one of the first and second magnetic layers.

5. The device of claim 1, wherein the first resistive magnetic layer is formed of a material having about a hundred times to about a thousand times the resistivity of at least one of the first and second magnetic layers.

6. The device of claim 1, wherein the first resistive magnetic layer is formed of a magnetic material.

7. The device of claim 1, wherein the first resistive magnetic layer is formed of an amorphous ferro-magnet.

8. The device of claim 1, wherein the first resistive magnetic layer is formed of at least one of Co—Zr—Nb and Co—Fe—B.

9. The device of claim 1, wherein the first resistive magnetic layer is formed of a magnetic material doped with at least one element selected from the group consisting of Cr, Pt, Pd, Mn, Hf, Au, Ir, Fe, Co, Ni, and Si.

10. The device of claim 1, wherein at least one of the first and second magnetic layers is formed of at least one material selected from the group consisting of Ni—Fe, Co, Co—Ni, Co—Fe, Co—Cr, Fe—Pt, and Co—Fe—Ni.

11. A method of forming a data storage device using magnetic domain wall motion, the method comprising:
    forming a first magnetic layer having a plurality of magnetic domains and a magnetic domain wall between two adjacent magnetic domains, the magnetic domain wall being movable in the first magnetic layer;
    forming a second magnetic layer connected to the first magnetic layer;
    forming a connection layer between the first and second magnetic layers, the connection layer being made of a magnetic material; and
    forming a first resistive magnetic layer between at least one of the first and second magnetic layers and the connection layer.

12. The method of claim 11, further comprising:
    forming a second resistive magnetic layer adjacent to a region of the first magnetic layer adjoining the connection layer.

13. The method of claim 11, further comprising:
    forming a third resistive magnetic layer adjacent to a region of the second magnetic layer adjoining the connection layer.

14. The method of claim 11, wherein the first resistive magnetic layer is formed of a material having about ten times to about ten thousand times the resistivity of at least one of the first and second magnetic layers.

15. The method of claim 11, wherein the first resistive magnetic layer is formed of a material having about a hundred times to about a thousand times the resistivity of at least one of the first and second magnetic layers.

16. The method of claim 11, wherein the first resistive magnetic layer is formed of a magnetic material.

17. The method of claim 11, wherein the first resistive magnetic layer is formed of an amorphous ferro-magnet.

18. The method of claim 11, wherein the first resistive magnetic layer is formed of at least one of Co—Zr—Nb and Co—Fe—B.

19. The method of claim 11, wherein the first resistive magnetic layer is formed of a magnetic material doped with at least one element selected from the group consisting of Cr, Pt, Pd, Mn, Hf, Au, Ir, Fe, Co, Ni, and Si.

20. The method of claim 11, wherein at least one of the first and second magnetic layers is formed of at least one material selected from the group consisting of Ni—Fe, Co, Co—Ni, Co—Fe, Co—Cr, Fe—Pt, and Co—Fe—Ni.

21. The device of claim 1, wherein the data storage device is configured to move the magnetic domain wall from the first magnetic layer to the second magnetic layer through the connection layer, and vice versa.

22. The method of claim 11, wherein the data storage device is configured to move the magnetic domain wall from the first magnetic layer to the second magnetic layer through the connection layer, and vice versa.

* * * * *